US011437996B2

(12) United States Patent
Shang et al.

(10) Patent No.: US 11,437,996 B2
(45) Date of Patent: Sep. 6, 2022

(54) DYNAMIC CONTROL CONVERSION CIRCUIT

(71) Applicant: CHANGXIN MEMORY TECHNOLOGIES, INC., Anhui (CN)

(72) Inventors: WeiBing Shang, Shanghai (CN); Sungsoo Chi, Shanghai (CN); Ying Wang, Shanghai (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 0 days.

(21) Appl. No.: 17/408,614

(22) Filed: Aug. 23, 2021

(65) Prior Publication Data

US 2021/0384908 A1 Dec. 9, 2021

Related U.S. Application Data

(63) Continuation of application No. PCT/CN2021/073328, filed on Jan. 22, 2021.

(30) Foreign Application Priority Data

Mar. 24, 2020 (CN) .......................... 202010211358.4

(51) Int. Cl.
*H03K 19/0185* (2006.01)
*H03K 19/0175* (2006.01)

(52) U.S. Cl.
CPC . *H03K 19/018521* (2013.01); *H03K 19/0175* (2013.01); *H03K 19/018507* (2013.01)

(58) Field of Classification Search
CPC ....... H03K 19/0175; H03K 19/017509; H03K 19/0185; H03K 19/018507; H03K 19/018521
See application file for complete search history.

(56) References Cited

U.S. PATENT DOCUMENTS 5,825,215 A  10/1998 Sugio
6,249,169 B1  6/2001 Okada
(Continued)

FOREIGN PATENT DOCUMENTS

CN  1165435 A  11/1997
CN  101420224 A  4/2009
(Continued)

OTHER PUBLICATIONS

Supplementary European Search Report in the European application No. 21761958.4, dated May 10, 2022, 8 pgs.

*Primary Examiner* — Patrick O Neill
(74) *Attorney, Agent, or Firm* — Cooper Legal Group, LLC

(57) ABSTRACT

The present disclosure relates to a dynamic control conversion circuit, which includes: a dynamic control unit configured to generate a dynamic control signal according to a received input signal; a first semiconductor switch, a control terminal of the first semiconductor switch is connected with a first signal output terminal of the dynamic control unit, and a first terminal of the first semiconductor switch is connected with a first voltage terminal; a second semiconductor switch, a control terminal of the second semiconductor switch is connected with a second signal output terminal of the dynamic control unit; and a circuit output unit having a first control terminal connected with a second terminal of the first semiconductor switch and a first terminal of the second semiconductor switch, and a second control terminal connected with a second terminal of the second semiconductor switch and a third signal output terminal of the dynamic control unit.

9 Claims, 4 Drawing Sheets

(56) References Cited

U.S. PATENT DOCUMENTS

| | | | |
|---|---|---|---|
| 7,786,760 B2 | 8/2010 | Wang | |
| 10,469,084 B2 | 11/2019 | Paasio et al. | |
| 2009/0108870 A1 | 4/2009 | Wang | |
| 2010/0277216 A1 | 11/2010 | Wang | |
| 2011/0037508 A1* | 2/2011 | Lundberg | H03K 3/012 |
| | | | 327/333 |
| 2017/0373691 A1 | 12/2017 | Paasio et al. | |
| 2018/0287600 A1 | 10/2018 | Iida et al. | |

FOREIGN PATENT DOCUMENTS

| | | |
|---|---|---|
| CN | 104333366 A | 2/2015 |
| CN | 107547080 A | 1/2018 |

\* cited by examiner

DYNAMIC CONTROL CONVERSION CIRCUIT

CROSS-REFERENCE TO RELATED APPLICATION

This application is a continuation of International Application No. PCT/CN2021/073328, filed on Jan. 22, 2021, which claims priority to Chinese patent application No. 202010211358.4, filed on Mar. 24, 2020 and entitled "Dynamic Control Conversion Circuit". The disclosures of International Application No. PCT/CN2021/073328 and Chinese patent application No. 202010211358.4 are hereby incorporated by reference in their entireties.

TECHNICAL FIELD

The present disclosure relates to the field of a semiconductor technology, and specifically relates to a dynamic control conversion circuit.

BACKGROUND

When designing an integrated circuit, people often encounter the situation that requires potential conversion of a voltage signal. For example, when the working voltage requirements are different, the voltage signal needs to be converted and adjusted in time. In the prior art, a conversion chip with a complex structure is generally used as an intermediate transmission circuit to realize potential conversion. However, the traditional conversion chip not only has a high production cost, but also occupies a large area, thereby seriously affecting the use performance of the integrated circuit.

SUMMARY

The present disclosure aims to provide a dynamic control conversion circuit so as to overcome, at least to a certain extent, the technical problems of complex circuit structure, high production cost, large occupied area, etc. due to the limitations and defects of related technologies.

According to an aspect of the present disclosure, a dynamic control conversion circuit is provided. The circuit includes:

a dynamic control unit configured to generate a dynamic control signal according to a received input signal;

a first semiconductor switch, a control terminal of the first semiconductor switch is connected with a first signal output terminal of the dynamic control unit, and a first terminal of the first semiconductor switch is connected with a first voltage terminal;

a second semiconductor switch, a control terminal of the second semiconductor switch is connected with a second signal output terminal of the dynamic control unit; and a circuit output unit, a first control terminal of the circuit output unit is connected with a second terminal of the first semiconductor switch and a first terminal of the second semiconductor switch, and a second control terminal of the circuit output unit is connected with a second terminal of the second semiconductor switch and a third signal output terminal of the dynamic control unit.

In some exemplary embodiments of the present disclosure, based on the above technical solution, a potential of a power supply of the dynamic control unit is lower than a potential of the first voltage terminal.

In some exemplary embodiments of the present disclosure, based on the above technical solution, the second signal output terminal outputs a control signal which is as same as a control signal output by the first signal output terminal, and the third signal output terminal outputs a control signal which is different from the control signal output by the first signal output terminal.

In some exemplary embodiments of the present disclosure, based on the above technical solution, the circuit output unit includes:

a third semiconductor switch, a control terminal of the third semiconductor switch serves as the first control terminal of the circuit output unit, a first terminal of the third semiconductor switch is connected with a third voltage terminal, and a second terminal of the third semiconductor switch serves as an output terminal of the circuit output unit; and a fourth semiconductor switch, a control terminal of the fourth semiconductor switch serves as the second control terminal of the circuit output unit, a first terminal of the fourth semiconductor switch is connected with a fourth voltage terminal, and a second terminal of the fourth semiconductor switch serves as the output terminal of the circuit output unit.

In some exemplary embodiments of the present disclosure, based on the above technical solution, the third voltage terminal and the first voltage terminal have a same potential, and the fourth voltage terminal is a grounding voltage terminal.

In some exemplary embodiments of the present disclosure, based on the above technical solution, the dynamic control unit includes:

an AND gate element, a first input terminal of the AND gate element is used for receiving an input reset signal, a second input terminal of the AND gate element is used for receiving an input control signal, and an output terminal of the AND gate element serves as the first signal output terminal and the second signal output terminal of the dynamic control unit; and a NAND gate element, a first input terminal of the NAND gate element used for receiving receive the input reset signal, a second input terminal of the NAND gate element is used for receiving the input control signal, and an output terminal of the NAND gate element serves as the third signal output terminal of the dynamic control unit.

In some exemplary embodiments of the present disclosure, based on the above technical solution, the dynamic control unit may further include:

an inverter, an input terminal of the inverter is used for receiving the input reset signal, an output terminal of the inverter serves as a fourth signal output terminal of the dynamic control unit, and the fourth signal output terminal is connected with a third control terminal of the circuit output unit.

In some exemplary embodiments of the present disclosure, based on the above technical solution, the circuit output unit includes:

a third semiconductor switch, a control terminal of the third semiconductor switch serves as the first control terminal of the circuit output unit, a first terminal of the third semiconductor switch is connected with a third voltage terminal, and a second terminal of the third semiconductor switch serves as an output terminal of the circuit output unit;

a fourth semiconductor switch, a control terminal of the fourth semiconductor switch serves as the second control terminal of the circuit output unit, a first terminal of the fourth semiconductor switch is connected with the fourth voltage terminal, and a second terminal of the fourth semiconductor switch serves as the output terminal of the circuit output unit; and a fifth semiconductor switch, a control terminal of the fifth semiconductor switch serves as the third control terminal of the circuit output unit, a first terminal of the fifth semiconductor switch is connected with a fifth voltage terminal, and a second terminal of the fifth semiconductor switch serves as the output terminal of the circuit output unit.

In some exemplary embodiments of the present disclosure, based on the above technical solution, the third voltage terminal and the first voltage terminal have a same potential, and the fourth voltage terminal and the fifth voltage terminal are grounding voltage terminals.

In some exemplary embodiments of the present disclosure, based on the above technical solution, the first terminal of the first semiconductor switch is connected to the first voltage terminal through a sixth semiconductor switch, a control terminal of the sixth semiconductor switch is connected with the output terminal of the circuit output unit, a first terminal of the sixth semiconductor switch is connected with the first voltage terminal, and a second terminal of the sixth semiconductor switch is connected with the first terminal of the first semiconductor switch.

In the technical solutions provided by the exemplary embodiments of the present disclosure, by configuring the first semiconductor switch and the second semiconductor switch capable of alternately switching states, the problem of switch competition can be effectively avoided, and the dynamic conversion control of potential signals can be realized only with a small area occupation and a very low production cost. Furthermore, the dynamic control conversion circuit has the characteristic of simple structure and can improve the stability and reliability of an integrated circuit.

It should be understood that the above general descriptions and detailed descriptions below are only exemplary and explanatory and not intended to limit the disclosure.

BRIEF DESCRIPTION OF THE DRAWINGS

The accompanying drawings, which are incorporated in and constitute a part of this specification, illustrate embodiments consistent with the disclosure and, together with the specification, serve to explain the principles of the disclosure. It is apparent that the drawings in the following description are only some embodiments of the present disclosure. Those skilled in the art can also obtain other drawings according to these drawings without any creative work.

LIST OF REFERENCE NUMERALS

Figure 1:
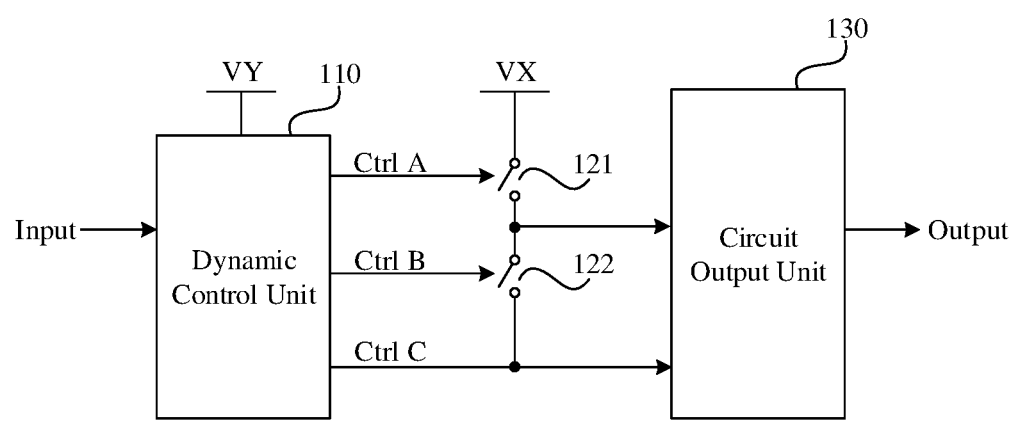
FIG. 1 schematically shows a schematic diagram of a circuit structure of a dynamic control conversion circuit in some exemplary embodiments of the present disclosure.

110: dynamic control unit;
130: circuit output unit;
111: AND gate element;
112: NAND gate element;
113: inverter;
121: first semiconductor switch;
122: second semiconductor switch;
123: third semiconductor switch;
124: fourth semiconductor switch;
125: fifth semiconductor switch;
126: sixth semiconductor switch;
VX: first voltage terminal;
VY: second voltage terminal;
VZ: third voltage terminal;
VO1: fourth voltage terminal;
VO2: fifth voltage terminal.

DETAILED DESCRIPTION

Example embodiments will now be described more fully with reference to the accompanying drawings. However, the example embodiments can be implemented in various forms, and should not be construed as being limited to the embodiments set forth herein. On the contrary, these embodiments are provided so that the disclosure will be comprehensive and complete, and will fully convey the concept of the example embodiments to those skilled in the art. The same reference numerals in the figures indicate the same or similar structures, and thus the detailed descriptions thereof are omitted.

Although relative terms, such as "upper" and "lower", are used in the present specification to describe the relative relationship between one component and another component illustrated in the drawings, these terms are used in the present specification only for convenience, for example, according to the directions of the examples illustrated in the drawings. It can be understood that if a device illustrated in the drawing is turned over and inverted, an "upper" component will become a "lower" component. When a structure is located "on" other structures, it may mean that the structure is integrally formed on other structures, or the structure is "directly" disposed on other structures, or the structure is "indirectly" disposed on other structures through another structure.

The terms "one", "a", "this", "the" and "at least one" are used to indicate that there are one or more elements, components, etc. The terms "include" and "have" are used to indicate open-ended inclusion and mean that there may be other elements, components, and the like besides the listed elements, components, and the like. The terms "first", "second" and "third" are only used illustrative purposes and are not intended to limit the number of objects.

FIG. 1 schematically shows a schematic diagram of a circuit structure of a dynamic control conversion circuit in some exemplary embodiments of the present disclosure. As shown in FIG. 1, the dynamic control conversion circuit may mainly include: a dynamic control unit 110, a first semiconductor switch 121, a second semiconductor switch 122 and a circuit output unit 130.

The dynamic control unit 110 is configured to generate a dynamic control signal according to a received input control signal Input. The dynamic control unit 110 may output a first control signal Ctrl A through a first signal output terminal, output a second control signal Ctrl B through a second signal output terminal, and output a third control signal Ctrl C through a third signal output terminal.

The first semiconductor switch 121 has a control terminal, a first terminal and a second terminal, and may be a P-channel Metal Oxide Semiconductor (PMOS) transistor, for example. The control terminal of the first semiconductor switch 121 is connected with the first signal output terminal of the dynamic control unit 110, and the first terminal of the first semiconductor switch 121 is connected to a first voltage terminal VX. The first control signal Ctrl A output by the first signal output terminal may be used for controlling the on and off of the first semiconductor switch 121.

The second semiconductor switch 122 has a control terminal, a first terminal and a second terminal, and may be an N-channel Metal Oxide Semiconductor (NMOS) transistor, for example. The control terminal of the second semiconductor switch 122 is connected with the second signal output terminal of the dynamic control unit 110. The second control signal Ctrl B output by the second signal output terminal may be used for controlling the on and off of the second semiconductor switch 122.

The circuit output unit 130 has a first control terminal, a second control terminal and an output terminal. The first control terminal of the circuit output unit 130 is connected with the second terminal of the first semiconductor switch 121 and the first terminal of the second semiconductor switch 122. The second control terminal of the circuit output unit 130 is connected with the second terminal of the second semiconductor switch 122 and the third signal output terminal of the dynamic control unit 110. The circuit output unit 130 may receive the third control signal Ctrl C output by the third signal output terminal or receive another control signal transmitted by the second semiconductor switch 122 through the second control terminal of the circuit output unit 130. The output terminal of the circuit output unit 130 is configured to generate an output signal Output.

A second voltage terminal VY is a power supply of the dynamic control unit 110. In some embodiments, the potential of the power supply is lower than the potential of the first voltage terminal VX, so that a signal conversion effect that a higher potential output is realized based on a lower potential input may be realized.

In the technical solutions provided by the exemplary embodiments of the present disclosure, by configuring the first semiconductor switch and the second semiconductor switch capable of alternately switching states, the problem of switch competition can be effectively avoided, and the dynamic conversion control of potential signals can be realized only by a small area occupation and a very low production cost. Furthermore, the dynamic control conversion circuit has the characteristic of simple structure and can improve the stability and reliability of an integrated circuit.

Figure 2:
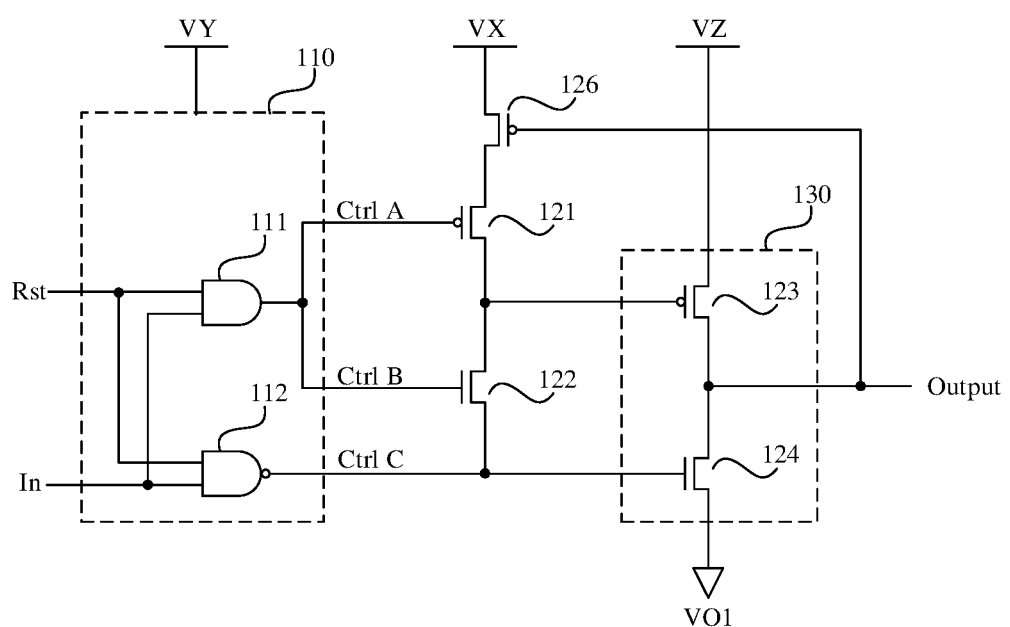
FIG. 2 schematically shows a schematic diagram of a circuit structure of a dynamic control conversion circuit in some other exemplary embodiments of the present disclosure.

FIG. 2 schematically shows a schematic diagram of a circuit structure of a dynamic control conversion circuit in some other exemplary embodiments of the present disclosure. As shown in FIG. 2, on the basis of the above embodiments, the dynamic control unit 110 may mainly include: an AND gate element 111 and a NAND gate element 112.

The AND gate element 111 has a first input terminal, a second input terminal and an output terminal. The first input terminal of the AND gate element 111 is used for receiving an input reset signal Rst, and the second input terminal of the AND gate element 111 is used for receiving an input control signal Input; and the output terminal of the AND gate element 111 serves as both the first signal output terminal and the second signal output terminal of the dynamic control unit 110, to output the same first control signal Ctrl A and second control signal Ctrl B, respectively. It should be noted that in some other embodiments, the first control signal and the second control signal may also be different control signals, which are not particularly limited in the present disclosure.

The NAND gate element 112 has a first input terminal, a second input terminal and an output terminal. The first input terminal of the NAND gate element 112 is used for receiving an input reset signal Rst, the second input terminal of the NAND gate element 112 is used for receiving an input control signal Input, and the output terminal of the NAND gate element 112 serves as the third signal output terminal of the dynamic control unit 110 to output a third control signal Ctrl C.

In the embodiment as shown in FIG. 2, the second signal output terminal outputs the same control signal as the control signal output by the first signal output terminal, that is, the second control signal Ctrl B is the same as the first control signal Ctrl A; and the third signal output terminal outputs a control signal different from the control signal output by the first signal output terminal, that is, the third control signal Ctrl C is different from the first control signal Ctrl A. For example, when the first control signal Ctrl A is a high-potential control signal, the second control signal Ctrl B is also a high-potential control signal, and the third control signal Ctrl C is a low-potential control signal; and when the first control signal Ctrl A is a low-potential control signal, the second control signal Ctrl B is also a low-potential control signal, and the third control signal Ctrl C is a high-potential control signal.

Continuing to refer to FIG. 2, the circuit output unit 130 may mainly include: a third semiconductor switch 123 and a fourth semiconductor switch 124.

The third semiconductor switch 123 has a control terminal, a first terminal and a second terminal, and may be a PMOS transistor, for example. The control terminal of the third semiconductor switch 123 serves as the first control terminal of the circuit output unit 130, to receive the control signal transmitted by the first semiconductor switch 121 or the second semiconductor switch 122. The first terminal of the third semiconductor switch 123 is connected with a third voltage terminal VZ; and the second terminal of the third semiconductor switch 123 serves as an output terminal of the circuit output unit 130, and can generate an output signal Output when the third semiconductor switch 123 is switched on.

The fourth semiconductor switch 124 has a control terminal, a first terminal and a second terminal, and may be an NMOS transistor, for example. The control terminal of the fourth semiconductor switch 124 serves as the second control terminal of the circuit output unit 130, to receive the control signal transmitted by the second semiconductor switch 122 or to receive the third control signal Ctrl C output by the third signal output terminal of the dynamic control unit 110. The first terminal of the fourth semiconductor switch 124 is connected with a fourth voltage terminal VO1, and the second terminal of the fourth semiconductor switch 124 serves as an output terminal of the circuit output unit 130, and can generate an output signal Output when the fourth semiconductor switch 124 is switched on.

In some embodiments, the third voltage terminal VZ and the first voltage terminal VX may have the same potential, and the fourth voltage terminal VO1 may be a grounding voltage terminal.

In some embodiments, as shown in FIG. 2, the first terminal of the first semiconductor switch 121 is connected to the first voltage terminal VX through a sixth semiconductor switch 126. The sixth semiconductor switch 126 has a control terminal, a first terminal and a second terminal, and may be a PMOS transistor, for example. The control terminal of the sixth semiconductor switch 126 is connected with the output terminal of the circuit output unit 130, the first terminal of the sixth semiconductor switch 126 is connected with the first voltage terminal VX, and the second terminal of the sixth semiconductor switch 126 is connected with the first terminal of the first semiconductor switch 121. By configuring the sixth semiconductor switch 126, real-time feedback of the output signal Output can be realized.

The control conversion principle of the dynamic control conversion circuit in the above embodiments will be described in detail below in conjunction with FIG. 2.

As shown in FIG. 2, the second voltage terminal VY can provide a potential signal with a high potential. When the input control signal Input changes, the dynamic control unit 110 can automatically switch the on and off states of the first semiconductor switch 121 and the second semiconductor switch 122 according to the signal change, thereby controlling the conversion of an output signal. For example:

When the input reset signal Rst has a high potential and the input control signal Input has a high potential, the first control signal Ctrl A and the second control signal Ctrl B output by the AND gate element 111 are both high-potential control signals. Under the control of the high-potential control signals, the first semiconductor switch 121 is in an off state (the resistance between the first terminal and second terminal of the first semiconductor switch 121 increases), and the second semiconductor switch 122 is in an on state (the resistance between the first terminal and second terminal of the second semiconductor switch 122 decreases). Meanwhile, the third control signal Ctrl C output by the NAND gate element 112 is a low-potential signal, and the low-potential signal is transmitted to both the control terminal of the third semiconductor switch 123 and the control terminal of the fourth semiconductor switch 124. Under the control of the low-potential third control signal Ctrl C, the third semiconductor switch 123 is in an on state, and the fourth semiconductor switch 124 is in an off state. On this basis, a potential signal with a high potential, provided by the first voltage terminal VX, can be transmitted by the third semiconductor switch 123 to form a high-potential output signal Output.

When the signal Rst has a high potential and the input control signal Input has a low potential, the first control signal Ctrl A and the second control signal Ctrl B output by the AND gate element 111 are both low-potential control signals. Under the control of the low-potential control signals, the first semiconductor switch 121 is in an on state, and the second semiconductor switch 122 is in an off state. Meanwhile, the third control signal Ctrl C output by the NAND gate element 112 is a high-potential signal, and the high-potential signal is transmitted to the control terminal of the fourth semiconductor switch 124. Under the control of the high-potential third control signal Ctrl C, the fourth semiconductor switch 124 is in an on state. On this basis, a potential signal with a low potential, provided by the fourth voltage terminal VO1, can be transmitted by the fourth semiconductor switch 124 to form a low-potential output signal Output.

When the output signal needs to be controlled to reset, the input reset signal Rst can be adjusted to have a low potential, and at this time, the output signal Output is reset to have a low potential, which is not affected by the potential change of the input control signal Input. After the resetting is completed, the input reset signal Rst can be adjusted to have a high potential again, and at this time, the control of the output signal Output can still be realized through the input control signal Input.

Figure 3:
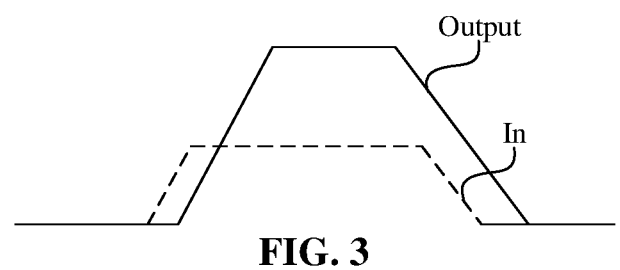
FIG. 3 schematically shows a schematic diagram of a signal change state of an output signal Output with the signal change state of an input control signal Input.

FIG. 3 schematically shows a schematic diagram of a signal change state of an output signal Output with a signal change state of an input control signal Input. As shown in FIG. 3, the dynamic control conversion circuit provided by the exemplary embodiments of the present disclosure can effectively realize the potential conversion of signals.

Figure 4:
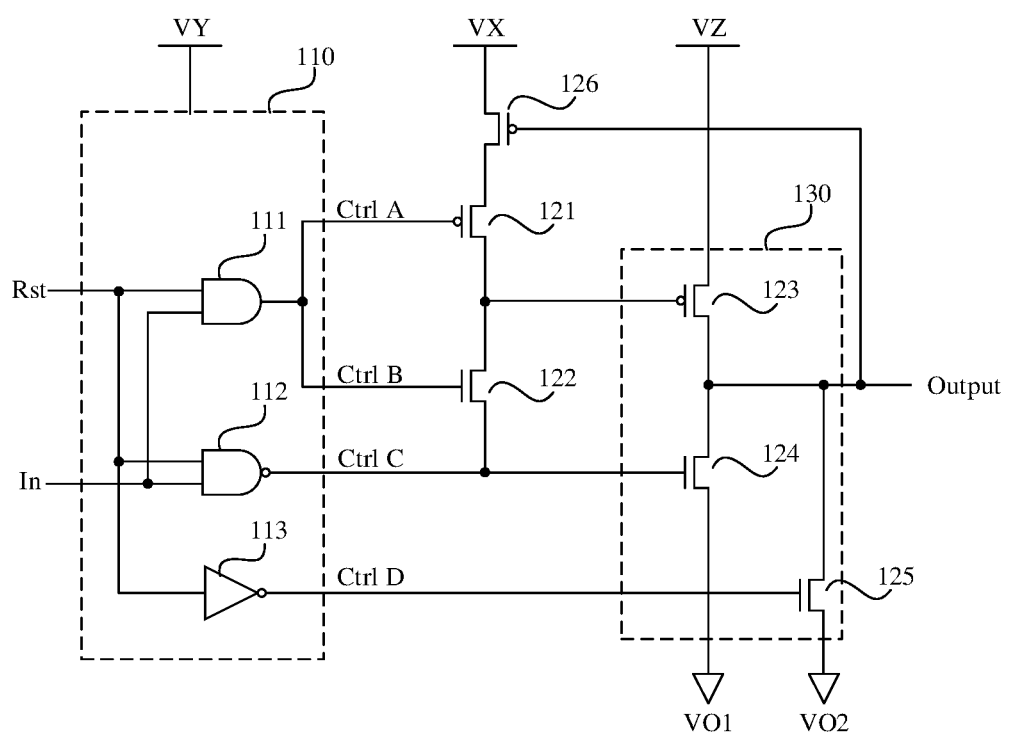
FIG. 4 schematically shows a schematic diagram of a circuit structure of a dynamic control conversion circuit in some other exemplary embodiments of the present disclosure.

FIG. 4 schematically shows a schematic diagram of a circuit structure of a dynamic control conversion circuit in some other exemplary embodiments of the present disclosure. As shown in FIG. 4, on the basis of the above embodiments, the dynamic control unit 110 may mainly include: an AND gate element 111, a NAND gate element 112 and an inverter 113.

The AND gate element 111 has a first input terminal, a second input terminal and an output terminal. The first input terminal of the AND gate element 111 is used for receiving an input reset signal Rst, the second input terminal of the AND gate element 111 is used for receiving an input control signal Input, and the output terminal of the AND gate element 111 serves as the first signal output terminal and the second signal output terminal of the dynamic control unit 110, to output the same first control signal Ctrl A and second control signal Ctrl B respectively. It should be noted that in some other embodiments, the first control signal and the second control signal may also be different control signals, which are not particularly limited in the present disclosure.

The NAND gate element 112 has a first input terminal, a second input terminal and an output terminal. The first input terminal of the NAND gate element 112 is used for receiving an input reset signal Rst, the second input terminal of the NAND gate element 112 is used for receiving an input control signal Input, and the output terminal of the NAND gate element 112 serves as the third signal output terminal of the dynamic control unit 110 to output a third control signal Ctrl C.

An input terminal of the inverter 113 is used for receiving an input reset signal Rst, an output terminal of the inverter 113 serves as the fourth signal output terminal of the dynamic control unit 110, and the fourth signal output terminal is connected with the third control terminal of the circuit output unit 130 to output a fourth control signal Ctrl D to the circuit output unit 130.

Continuing to refer to FIG. 4, the circuit output unit 130 may mainly include: a third semiconductor switch 123, a fourth semiconductor switch 124 and a fifth semiconductor switch 125.

The third semiconductor switch 123 has a control terminal, a first terminal and a second terminal, and may be a PMOS transistor, for example. The control terminal of the third semiconductor switch 123 serves as the first control terminal of the circuit output unit 130, to receive the control signal transmitted by the first semiconductor switch 121 or the second semiconductor switch 122. The first terminal of the third semiconductor switch 123 is connected with a third voltage terminal VZ. The second terminal of the third semiconductor switch 123 serves as an output terminal of the circuit output unit 130, and can generate an output signal Output when the third semiconductor switch 123 is switched on.

The fourth semiconductor switch 124 has a control terminal, a first terminal and a second terminal, and may be an NMOS transistor, for example. The control terminal of the fourth semiconductor switch 124 serves as the second control terminal of the circuit output unit 130, to receive the control signal transmitted by the second semiconductor switch 122 or to receive the third control signal Ctrl C output by the third signal output terminal of the dynamic control unit 110. The first terminal of the fourth semiconductor switch 124 is connected with a fourth voltage terminal VO1. The second terminal of the fourth semiconductor switch 124 serves as an output terminal of the circuit output unit 130, and can generate an output signal Output when the fourth semiconductor switch 124 is switched on.

The fifth semiconductor switch 125 has a control terminal, a first terminal and a second terminal, and may be an NMOS transistor, for example. The control terminal of the fifth semiconductor switch 125 serves as the third control terminal of the circuit output unit 130, to receive the fourth control signal Ctrl D output by the fourth signal output terminal of the dynamic control unit 110. The first terminal of the fifth semiconductor switch 125 is connected with a fifth voltage terminal VO2. The second terminal of the fifth semiconductor switch 125 serves as an output terminal of the circuit output unit, and can generate an output signal Output when the fifth semiconductor switch 125 is switched on.

In some embodiments, the third voltage terminal VZ and the first voltage terminal VX may have the same potential, and the fourth voltage terminal VO1 and the fifth voltage terminal VO2 may be grounding voltage terminals.

In the dynamic control conversion circuit as shown in FIG. 4, by configuring the reset control signal Rst, the output signal Output can be quickly and efficiently reset or set to an initial state. For example:

When the reset control signal Rst has a low potential, the fourth control signal Ctrl D output by the inverter 113 is a high-potential control signal. Under the control of the high-potential control signal, the fifth semiconductor switch 125 is in an on state. On this basis, a potential signal with a low potential, provided by the fifth voltage terminal VO2, can be transmitted by the fifth semiconductor switch 125 to form a low-potential output signal Output, thereby realizing the resetting of the output signal.

When the reset control signal Rst has a high potential, the fourth control signal Ctrl D output by the inverter 113 is a low-potential control signal. Under the control of the low-potential control signal, the fifth semiconductor switch 125 is in an off state. At this time, the conversion control of the output signal Output following the input control signal Input is the same as the control principle of the circuit as shown in FIG. 2 and will not be repeated here.

In addition, it should be noted that in the above exemplary embodiments, the NMOS transistor and the PMOS transistor are taken as examples to illustrate the switch devices, but the present disclosure is not limited thereto. Each of the switch devices may be selected from a Bipolar Junction Transistor (BJT) device, a Semiconductor Control Rectifier (SCR) device, a Complementary Metal Oxide Semiconductor (CMOS), etc. according to needs.

After considering the specification and implementing the disclosure disclosed here, other implementation solutions of the disclosure would readily be conceivable to a person skilled in the art. The present disclosure is intended to cover any variations, uses, or adaptations of the present disclosure following the general principles thereof and including such departures from the present disclosure as come within known or customary practice in the art. It is intended that the specification and embodiments be considered as exemplary only, with a true scope and spirit of the present disclosure being indicated by the appended claims.

The invention claimed is:

1. A dynamic control conversion circuit, comprising:
   a dynamic control circuit configured to generate a dynamic control signal according to a received input signal;
   a first semiconductor switch, wherein a control terminal of the first semiconductor switch is connected with a first signal output terminal of the dynamic control circuit, and a first terminal of the first semiconductor switch is connected with a first voltage terminal;
   a second semiconductor switch, wherein a control terminal of the second semiconductor switch is connected with a second signal output terminal of the dynamic control circuit; and
   a circuit output portion, wherein a first control terminal of the circuit output portion is connected with a second terminal of the first semiconductor switch and a first terminal of the second semiconductor switch, and a second control terminal of the circuit output portion is connected with a second terminal of the second semiconductor switch and a third signal output terminal of the dynamic control circuit,
   wherein the dynamic control circuit comprises:
      an AND gate element, wherein a first input terminal of the AND gate element is used for receiving an input reset signal, a second input terminal of the AND gate element is used for receiving an input control signal, and an output terminal of the AND gate element serves as the first signal output terminal and the second signal output terminal of the dynamic control circuit; and
      a NAND gate element, wherein a first input terminal of the NAND gate element is used for receiving the input reset signal, a second input terminal of the NAND gate element is used for receiving the input control signal, and an output terminal of the NAND gate element serves as the third signal output terminal of the dynamic control circuit.

2. The dynamic control conversion circuit of claim 1, wherein a potential of a power supply of the dynamic control circuit is lower than a potential of the first voltage terminal.

3. The dynamic control conversion circuit of claim 1, wherein the second signal output terminal outputs a control signal which is as same as a control signal output by the first signal output terminal, and the third signal output terminal outputs a control signal which is different from the control signal output by the first signal output terminal.

4. The dynamic control conversion circuit of claim 1, wherein the circuit output portion comprises:
   a third semiconductor switch, wherein a control terminal of the third semiconductor switch serves as the first control terminal of the circuit output portion, a first terminal of the third semiconductor switch is connected with a third voltage terminal, and a second terminal of the third semiconductor switch serves as an output terminal of the circuit output portion; and
   a fourth semiconductor switch, wherein a control terminal of the fourth semiconductor switch serves as the second control terminal of the circuit output portion, a first terminal of the fourth semiconductor switch is connected with a fourth voltage terminal, and a second terminal of the fourth semiconductor switch serves as the output terminal of the circuit output portion.

5. The dynamic control conversion circuit of claim 4, wherein the third voltage terminal and the first voltage terminal have a same potential, and the fourth voltage terminal is a grounding voltage terminal.

6. The dynamic control conversion circuit of claim 1, wherein the dynamic control circuit further comprises:
an inverter, wherein an input terminal of the inverter is used for receiving the input reset signal, an output terminal of the inverter serves as a fourth signal output terminal of the dynamic control circuit, and the fourth signal output terminal is connected with a third control terminal of the circuit output portion.

7. The dynamic control conversion circuit of claim 6, wherein the circuit output portion comprises:
a third semiconductor switch, wherein a control terminal of the third semiconductor switch serves as the first control terminal of the circuit output portion, a first terminal of the third semiconductor switch is connected with a third voltage terminal, and a second terminal of the third semiconductor switch serves as an output terminal of the circuit output portion;
a fourth semiconductor switch, wherein a control terminal of the fourth semiconductor switch serves as the second control terminal of the circuit output portion, a first terminal of the fourth semiconductor switch is connected with a fourth voltage terminal, and a second terminal of the fourth semiconductor switch serves as the output terminal of the circuit output portion; and
a fifth semiconductor switch, wherein a control terminal of the fifth semiconductor switch serves as the third control terminal of the circuit output portion, a first terminal of the fifth semiconductor switch is connected with a fifth voltage terminal, and a second terminal of the fifth semiconductor switch serves as the output terminal of the circuit output portion.

8. The dynamic control conversion circuit of claim 7, wherein the third voltage terminal and the first voltage terminal have a same potential, and the fourth voltage terminal and the fifth voltage terminal are grounding voltage terminals.

9. The dynamic control conversion circuit of claim 1, wherein the first terminal of the first semiconductor switch is connected to the first voltage terminal through a sixth semiconductor switch, a control terminal of the sixth semiconductor switch is connected with an output terminal of the circuit output portion, a first terminal of the sixth semiconductor switch is connected with the first voltage terminal, and a second terminal of the sixth semiconductor switch is connected with the first terminal of the first semiconductor switch.

* * * * *